(12) United States Patent
Downes et al.

(10) Patent No.: US 7,155,821 B1
(45) Date of Patent: Jan. 2, 2007

(54) TECHNIQUES FOR MANUFACTURING A CIRCUIT BOARD HAVING A COUNTERSUNK VIA

(75) Inventors: Stuart D. Downes, Milford, MA (US); Louis H. Feinstein, Sharon, MA (US)

(73) Assignee: EMC Corporation, Hopkinton, MA (US)

( * ) Notice: Subject to any disclaimer, the term of this patent is extended or adjusted under 35 U.S.C. 154(b) by 107 days.

(21) Appl. No.: 10/881,588

(22) Filed: Jun. 30, 2004

(51) Int. Cl.
*H01K 3/10* (2006.01)

(52) U.S. Cl. .............................. 29/852; 29/825; 29/842; 29/843

(58) Field of Classification Search .................. 29/825, 29/842, 843, 852
See application file for complete search history.

(56) References Cited

U.S. PATENT DOCUMENTS

| | | | | |
|---|---|---|---|---|
| 5,038,252 A | * | 8/1991 | Johnson ....................... 361/792 |
| 5,589,669 A | | 12/1996 | Downes et al. ............. 174/266 |
| 5,841,075 A | * | 11/1998 | Hanson ....................... 174/250 |
| 6,084,397 A | | 7/2000 | Downes ..................... 324/158.1 |
| 6,179,631 B1 | | 1/2001 | Downes et al. ............... 439/83 |
| 6,181,219 B1 | * | 1/2001 | Gailus et al. .................. 333/33 |
| 6,222,277 B1 | | 4/2001 | Downes ....................... 257/778 |
| 6,347,734 B1 | | 2/2002 | Downes ................. 228/180.21 |
| 6,386,435 B1 | | 5/2002 | Downes .................... 228/248.1 |
| 6,398,935 B1 | | 6/2002 | Downes ........................ 205/81 |
| 6,429,645 B1 | | 8/2002 | Downes .................... 324/158.1 |
| 6,478,604 B1 | | 11/2002 | Downes et al. ............. 439/400 |
| 6,483,041 B1 | | 11/2002 | Downes ....................... 174/260 |
| 6,544,392 B1 | | 4/2003 | Downes ....................... 204/242 |
| 6,552,277 B1 | | 4/2003 | Downes ....................... 174/267 |
| 6,637,641 B1 | | 10/2003 | Downes et al. ............. 228/102 |
| 6,663,442 B1 | * | 12/2003 | Helster et al. .............. 439/751 |
| 6,716,072 B1 | | 4/2004 | Downes ....................... 439/876 |
| 6,773,269 B1 | | 8/2004 | Downes ........................ 439/75 |
| 6,800,545 B1 | | 10/2004 | Downes ....................... 438/612 |
| 6,953,892 B1 | * | 10/2005 | Striebel ...................... 174/52.4 |

FOREIGN PATENT DOCUMENTS

| | | | | |
|---|---|---|---|---|
| DE | 2338647 A | * | 2/1975 |
| JP | 09-046019 A | * | 2/1997 |
| JP | 10-230405 A | * | 9/1998 |

* cited by examiner

*Primary Examiner*—Carl J. Arbes
(74) *Attorney, Agent, or Firm*—BainwoodHuang

(57) ABSTRACT

A technique for manufacturing a circuit board involves obtaining a plane-shaped structure having layers of circuit board material integrated together, and carving a hole within the plane-shaped structure (e.g., using a single countersinking drill bit). The carved hole includes an inner portion having a substantially uniform inner portion diameter and a connecting portion disposed between the inner portion and an outer surface of the plane-shaped structure. At least part of the connecting portion has a diameter which is larger than the substantially uniform inner portion diameter of the inner portion to improve access to the inner portion. The technique further involves
performing a plating process on the plane-shaped structure to provide plating over the hole carved within the plane-shaped structure. The provided plating forms a countersunk via which provides an electrical pathway from the outer surface of the plane-shaped structure to an internal circuit board trace.

23 Claims, 11 Drawing Sheets

TECHNIQUES FOR MANUFACTURING A CIRCUIT BOARD HAVING A COUNTERSUNK VIA

BACKGROUND OF THE INVENTION

In general, a via is a hole within a circuit board which is lined with conductive material (e.g., copper, nickel, etc.) to provide an electrical pathway between multiple conductive layers of the circuit board. A typical circuit board includes many vias in order to achieve layer-to-layer interconnections between various conductive circuit board features (e.g., surface pads and traces, inner functional signal layers, power planes, ground planes, etc.).

One type of via, which extends completely through a circuit board (i.e., from one outer surface to the other outer surface on the opposite side of the circuit board), is called a "through via". Some circuit board manufacturers do not draw distinctions between the term "through via" and the term "plated through hole" (PTH), which refers to a structure that is intended to support a component lead (e.g., a pin in hole configuration). Accordingly, within this document, the term "through via" is intended to refer generally to both through vias and plated through holes.

Another type of via, which extends only partially through a circuit board (i.e., the via hole does not pass completely through the circuit board), is called a "blind via". A blind via typically starts on one outer surface of the circuit board and extends perpendicularly into the circuit board to the first inner signal layer or plane. Traces and planes beneath this layer are allowed to pass under the blind via without interruption thus enabling the manufacturer to locate a higher density of conductive circuit board features in the same area (e.g., blind vias on both sides of the circuit board, inner signal layers and conductive planes underneath the blind vias, etc.).

In general there are two conventional approaches to creating blind vias. One approach involves creating through vias in two thinner circuit board sections and then combining these sections together (e.g., using a laminating and pressing process) to form the circuit board. Another approach involves drilling out blind via holes from a circuit board substrate, and then forming both the blind vias and through vias concurrently using a plating process. In this latter approach, the aspect ratio between via hole depth and via hole width is substantially limited in order to guarantee reliable cleaning and plating and to avoid trapping process chemistries (e.g., acid traps). For instance, in order to comply with a design rule imposing a blind via aspect ratio which is no greater than 0.5-to-1 to enable reliable plating and cleaning, a blind via which is 8 mils in diameter (i.e., 0.008 inches) is allowed to extend up to 4 mils deep to the next conductive layer of the circuit board.

Another type of via, which is completely embedded within a circuit board (i.e., the via hole does not extend to any outer surface of the circuit board), is called a "buried via". A buried via connects two or more inner conductive layers but is not directly visible on the outer surface of either side of the circuit board. Traces and/or conductive planes above and below the buried via are allowed to pass without interruption thus enabling the manufacturer another opportunity to locate a higher density of conductive circuit board features in the same area (e.g., signal traces, conductive planes, etc. above and below the buried via). Although buried vias are not directly accessible since they do not extend to an outer circuit board surface, other vias (e.g., through vias and/or blind vias) typically connect to buried vias by way of inner layer signal traces to provide external electrical access to the buried vias.

SUMMARY OF THE INVENTION

Unfortunately, there are deficiencies to circuit boards which use only the above-described conventional through, blind and buried vias. For example, in connection with the above-described conventional through vias, it is difficult for circuit board manufacturers to achieve connectivity goals using through vias alone. The trend toward miniaturization and increased functional input/output (I/O) continues thus driving component pitches to smaller grid dimensions and exacerbating the need for alternatives to simply using through vias. Nevertheless, one way to continue to use through vias exclusively is for circuit board manufacturers to add circuit board layers resulting in thicker and more massive circuit boards which significantly raises costs. Another way to continue to use through vias exclusively is to shrink circuit board structures down as much as possible such as "dog bone" features and through via diameters (e.g., microvias). However, at some point, such features are no longer manufacturable in a reliable manner even though special processes are available such as pulse plating and plasma hole wall preparation (e.g., the smaller the via diameter the greater the narrow chimney effect on the via being plated and cleaned).

Additionally, in connection with conventional blind vias, creation of blind vias can be expensive and the use of blind vias can be limited. In particular, when creating blind vias by combining multiple circuit board sections having through vias, the lamination and pressing process provides a substantial increase in manufacturing costs due to the need for additional equipment such as tooling and handling equipment needed to align circuit board sections, X-ray registration equipment, etc. Even with such equipment, there is never 100% yield (e.g., due to registration errors) and, as a result, there is opportunity to lose significant added value during the lamination and pressing process.

Furthermore, when creating conventional blind vias by drilling partially into circuit boards, design rule constraints limit the depth and width of the blind vias available to the circuit board manufacturer. That is, if the manufacturer attempts to create blind via holes which go beyond the design rule aspect ratio by making the blind vias too deep, the manufacturer will be unable to properly clean and plate the blind vias. Without the ability to set blind vias more deeply into the circuit boards, circuit board manufactures are unable to truly utilize blind vias due to routing channel restrictions (i.e., not enough space within the circuit board to connect traces to the blind vias). Moreover, with conventional blind vias and dog bone configurations, there is typically very little space left to properly form electrically tuned anti-pads for proper impedance control.

Moreover, in connection with conventional buried vias, creation of buried vias within circuit boards is very expensive. In particular, creating buried vias requires a lamination and pressing process thus providing a substantial increase in manufacturing costs due to the need for additional equipment. Additionally, as mentioned above in connection with buried vias, there is never 100% yield and, as a result, there is increased opportunity to lose a significant amount of added value by less than perfect yields in the additional lamination and pressing processing.

In contrast to the above-described conventional vias, embodiments of the invention are directed to circuit board manufacturing techniques which involve carving a countersunk via hole within circuit board material to form a countersunk via. Such carving is capable of taking place at the same time as the drilling process for creating through vias thus alleviating the need for an additional expensive laminating and pressing process (e.g., as when creating conventional blind and buried vias). Additionally, the countersunk via resulting from such carving is capable of interconnecting several internal signal layers thus providing greater opportunity to achieve high connection densities and thus perhaps alleviating the need for additional circuit board layers to reduce costs even further.

One embodiment of the invention is directed to a method for manufacturing a circuit board. The method includes obtaining a plane-shaped structure having layers of circuit board material integrated together, and carving a hole within the plane-shaped structure (e.g., using a single countersinking drill bit). The carved hole includes an inner portion having a substantially uniform inner portion diameter and a connecting portion disposed between the inner portion and an outer surface of the plane-shaped structure. At least part of the connecting portion has a diameter which is larger than the substantially uniform inner portion diameter of the inner portion to improve access to the inner portion. The method further includes performing a plating process on the plane-shaped structure to provide plating over the hole carved within the plane-shaped structure. The provided plating forms a countersunk via which provides an electrical pathway from the outer surface of the plane-shaped structure to an internal circuit board trace.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to circuit board manufacturing techniques which involve carving a countersunk via hole within circuit board material to form a countersunk via. Such carving is capable of taking place at the same time as the drilling process for creating through vias thus alleviating the need for an additional laminating and pressing process which would otherwise increase costs (e.g., as required when creating conventional blind and buried vias). Furthermore, the countersunk via resulting from such carving is capable of interconnecting several internal signal layers by going deeper into the circuit board material than a conventional blind via without posing a manufacturability or quality threat thus providing greater opportunity to achieve high connection densities and thus perhaps alleviating the need for one or more additional circuit board layers.

Figure 1:
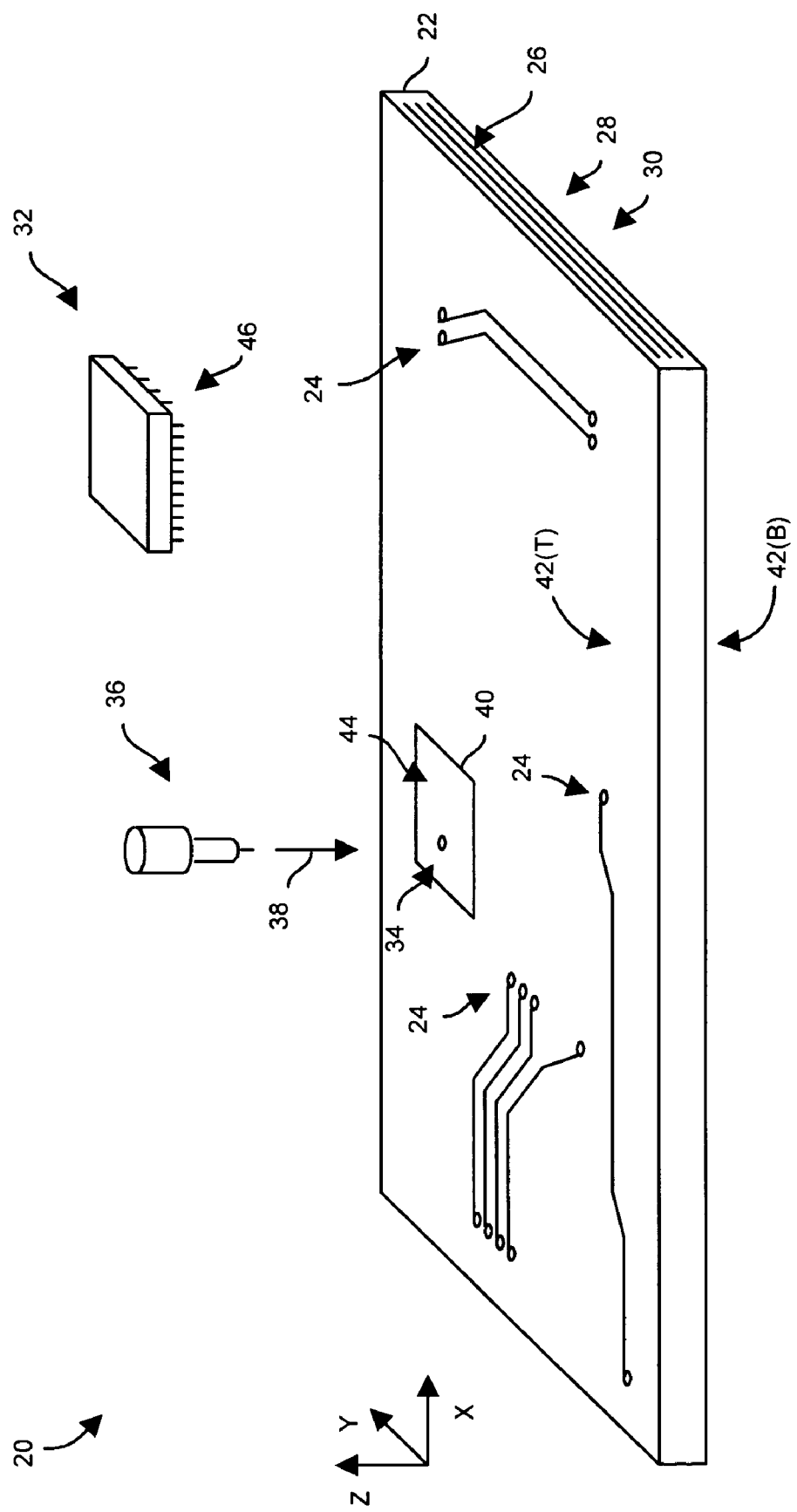
FIG. 1 is a perspective view of a circuit board which is suitable for use by the invention.

FIG. 1 shows a fabricated circuit board 20 which is suitable for use by the invention. The fabricated circuit board 20 includes, among other things, a plane-shaped circuit board structure 22 and vias 24 disposed within the circuit board structure 22. The circuit board structure 22 includes layers of circuit board material 26 which are integrated together into a rigid PCB substrate which extends along the X-Y plane.

The layers of circuit board material 26 include conductive material layers 28 (e.g., copper) and non-conductive material layers 30 (e.g., FR-4) making the circuit board structure 22 well suited for simultaneously (i) supporting a variety of components 32 (e.g., integrated circuit devices, discrete components, connectors, etc.), and (ii) providing a network of electrical pathways which connect the components 32 together. The conductive material layers 28 include pads, signal traces and conductive planes along the X-Y plane. The vias 24 interconnect these pads, signal traces and conductive planes in the Z-direction. The vias 24 also provide mechanical stability to the plane-shaped structure 22 by firmly holding the layers 26 together particularly during times of stress, e.g., due to uneven thermal expansion.

Some of the vias 24 of the circuit board structure 22 are countersunk vias which are relatively easy to manufacturer and which provide better fanout capacity than conventional blind vias. In some situations, the use of such countersunk vias provides enough connectivity that it alleviates the need for one or more conductive layers 28. As will be explained in further detail shortly, the process for making these countersunk vias involves defining carved holes 34 within the circuit board structure 22, and then submitting the circuit board structure 22 through a plating process. In some arrangements, the same plating process which is used for forming through vias is used for forming the countersunk vias thus alleviating the need for an additional plating process.

One approach to defining the carved holes 34 is to drill out material from the plane-shaped structure 22 using a specialized countersinking drill bit 36. The use of such a drill bit enables creation of the carved holes 34 in a single drilling operation (see the arrow 38). An alternative approach to defining the carved holes 34 is to drill out material from the structure 22 using multiple drilling operations with different sized drill bits, e.g., a first drilling operation to form a larger outer hole, and a second drilling operation to form a narrower hole which is substantially concentric but deeper than the larger outer hole.

By way of example only, the circuit board structure 22 includes a component mounting location 40 on an outer top surface 42(T) of the circuit board structure 22. The component mounting location 40 is formed, at least in part, by an array 44 of the countersunk vias 24 (illustrated by the arrow 44 for simplicity). This component mounting location 38 is well suited for mounting with an Area Array Package (AAP) (PBGAs, CBGAs, CGAs, etc.) having a dense array of contacts 46 (e.g., an array of solder balls, an array of columns, an array of pins, etc.), see the component 32 in FIG. 1. Features which are similar to the component mounting location 40 are also capable of being disposed on an outer bottom surface 42(B) which is opposite the outer top surface 42(T). Further details of various embodiments of the invention will now be provided with reference to FIG. 2.

Figure 2:
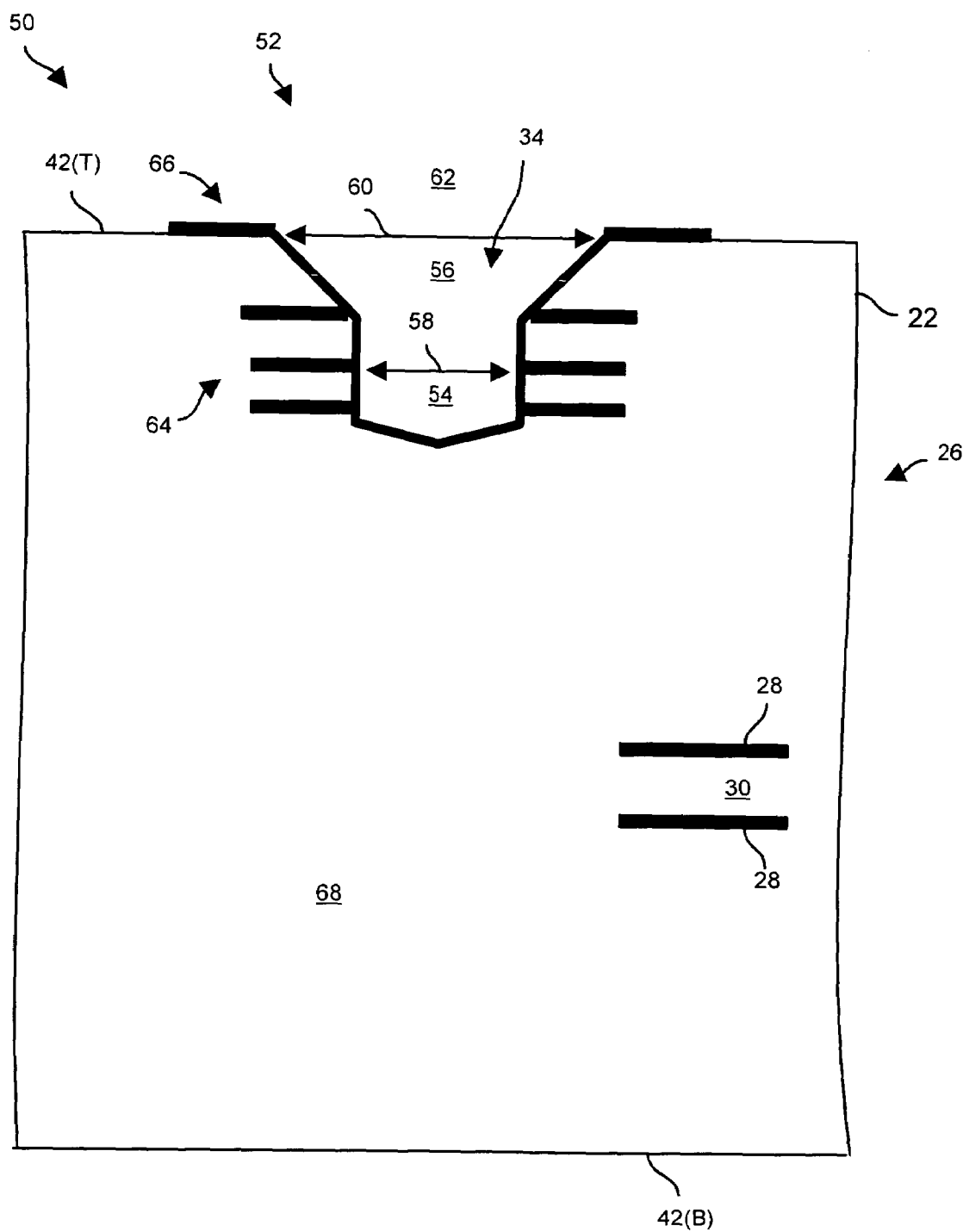
FIG. 2 is a cross-sectional side view of a first countersunk via which extends partially through the circuit board of FIG. 1.

FIG. 2 is a cross-sectional side view 50 of a countersunk via 52 disposed within the circuit board structure 22 (also see the vias 24 in FIG. 1). As shown in FIG. 2, the countersunk via 52 has a blind configuration, i.e., the via 52 does not extend complete through the structure 22 to the outer surface 42(B). The countersunk via 52 is formed by plating within a carved hole 34 having (i) an inner portion 54, and (ii) a connecting portion 56 which is disposed between the inner portion 54 and the outer top surface 42(T). Such portions 54, 56 are formed after the circuit board structure 22 is formed (i.e., after all lamination steps have been completed). The inner portion 54 has a substantially uniform inner portion diameter 58. At least a portion of the connecting portion 56 has a diameter 60 which is larger than the diameter 58 of the inner portion 54 thus improving access to the inner portion 54 from an external location 62. This feature will now be explained in further detail.

Suppose that a circuit board manufacturer wishes to use conventional blind vias in a circuit board rather than through vias in order to position other conductive features beneath the blind vias and thus increase circuit board feature density. The circuit board manufacturer can employ one of two conventional approaches. In particular, in a first conventional approach, the circuit board manufacturer creates blind vias which are relatively shallow and only penetrate into one or perhaps two conductive layers. For example, in order to comply with a design rule aspect ratio of 0.5-to-1 between via depth and via diameter, the manufacturer is only able to make an 8 mil diameter via 4 mils deep. This 4 mil depth is typically only deep enough to connect to the first inner conductive layer which is likely a power plane or ground plane thus severely limiting the fanout capabilities of the blind via.

In a second conventional approach, the circuit board manufacturer makes a deeper blind via by separately fabricating thinner circuit board portions and subsequently registering and laminating these portions together. In particular, the manufacturer forms blind and/or through vias in the thinner circuit board portions and then overlays the portions on top of each other. Any coinciding vias form deeper vias (e.g., deeper blind vias). Unfortunately, this approach is significantly more costly since this requires multiple fabrication processes and the extra step of lamination and pressing. There is also the risk of losing a significant amount of added value at this point (e.g., due to a registration error when combining PCB portions).

In contrast to these conventional blind vias, the countersunk via 52 of FIG. 2 is capable of being created concurrently with creation of conventional through vias. In particular, the manufacturer is capable drilling the portions 54, 56 at the same time the manufacturer drills other holes for through vias. Additionally, the manufacturer is capable of plating the portions 54, 56 at the same time the manufacturer plates the through vias. Cleaning and plating of the inner portion 54 is not hindered and no additional lamination steps are needed. Rather, the aspect ratio of the inner portion 54 is capable of complying with normal processing design rules (e.g., complying with a 0.5-to-1 aspect ratio between depth and diameter of the inner portion 54), and the wider connecting portion 56 enables cleaning and plating processes to robustly access the inner portion 54. Specifically, the inner portion 54 poses no more of an chemical or debris trap threat than a conventional blind via.

However, the total depth of the countersunk via 52 is capable of being significantly deeper than a conventional blind via. This increase in depth, in combination with the wider diameter connecting portion 56, over conventional blind vias enables the countersunk via 52 to have greater fanout capacity. In some situations, this increase in fanout capacity may alleviate the need for an extra signal layer thus providing additional savings to the manufacturer. For illustration purposes, FIG. 2 shows the countersunk via 52 connecting to the internal pads 64 of several (e.g., three) inner conductive layers 28 in addition to a conductor 66 of the surface layer 42(T) of the structure 22.

In one arrangement, the carved hole 34 for the countersunk via 52 has an aspect ratio of inner portion depth versus inner portion width of 0.5-to-1 or less (i.e., 0.5 or less to one) to enable proper cleaning and plating of the inner portion following formation of the inner and connecting portions of the carved hole 34 while the other end of the inner portion 54 is blocked. By way of example, the diameter 58 of the inner portion 54 is substantially 8 mils and the depth of the inner portion 54 is substantially 4 mils with a traditional error tolerance such as +3 mils. The inner portion 54 is further provided with over travel of substantially 1.5 mils. The width of the connection portion 56 is substantially 12 mils and the depth of connecting portion 56 is substantially 3.73 mils. The drill angle, or taper of the connecting portion 56, is set to be substantially 118 degrees. Accordingly, the aggregate depth of the countersunk via 52 is at least substantially 8 mils for robust fanout capacity. Moreover, the countersunk via 52 is capable of being formed using standard drilling and plating techniques without need of extra lamination and pressing.

Since the countersunk via 52 does not pass all of the way through the circuit board structure 22, other circuit board features are capable of being located underneath the countersunk via 52 between the countersunk via 52 and the outer bottom surface 42(B) for higher connection density (see the location 68 in FIG. 2). Further details will now be provided with reference to FIGS. 3 and 4.

Figure 3:
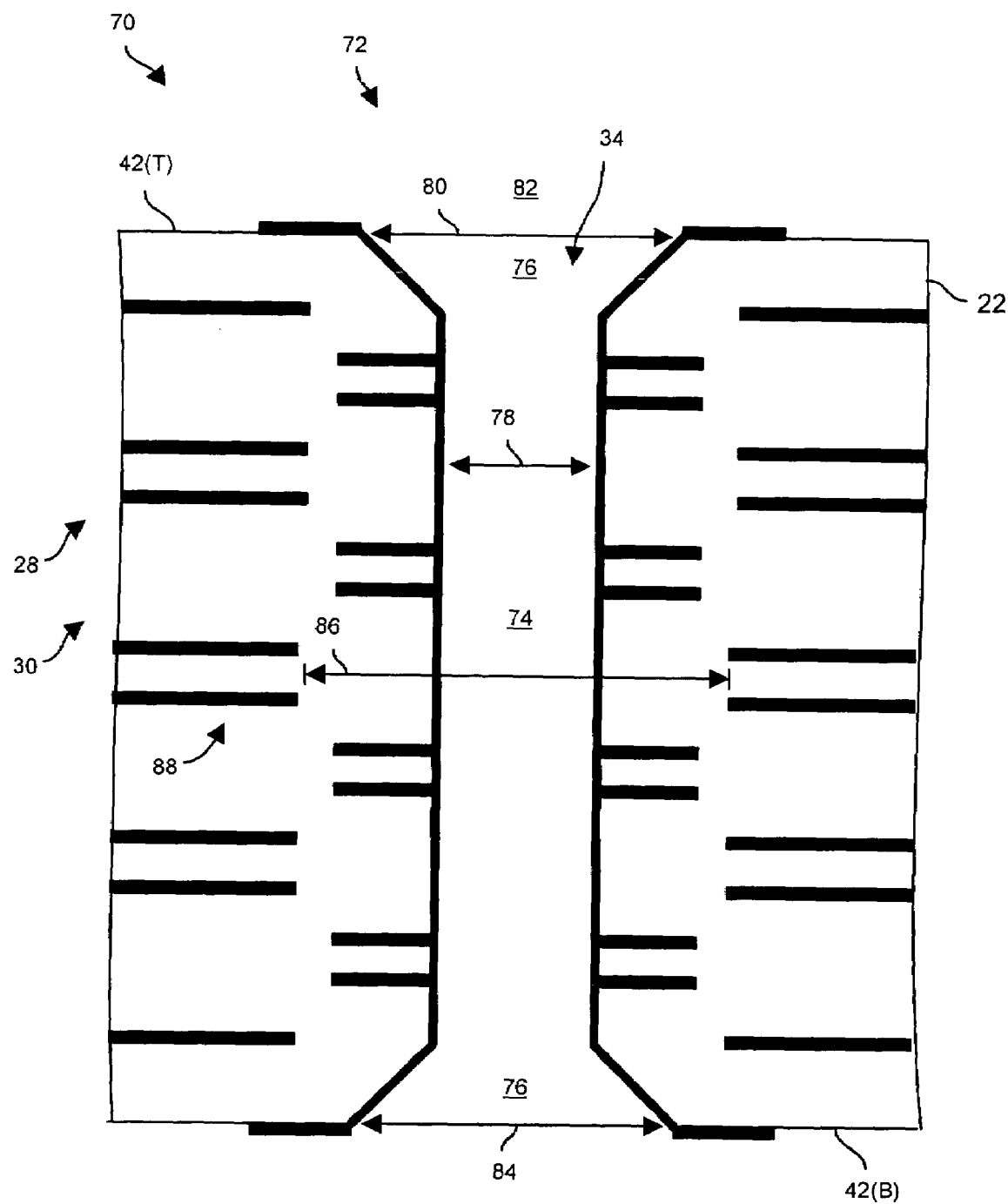
FIG. 3 is a cross-sectional side view of a second countersunk via which extends completely through the circuit board of FIG. 1.

FIG. 3 is a cross-sectional side view 70 of a second countersunk via 72 which is similar to the countersunk via 52 of FIG. 2 in that the second countersunk via 72 is formed from a carved hole 34 having an inner portion 74 and a connecting portion 76 which is disposed between the inner portion 74 and the outer top surface 42(T). Here, the inner portion 74 has a substantially uniform inner portion diameter 78. At least a portion of the connecting portion 76 has a diameter 80 which is larger than the diameter 78 of the inner portion 74 thus improving access to the inner portion 74 from an external location 82.

However, the countersunk via 72 of FIG. 3 differs from the countersunk via 52 of FIG. 2 in that the carved hole 34 for the countersunk via 72 extends completely through the circuit board structure 22. That is, the carved hole 34 includes a second connection portion 76 disposed between the inner portion 74 and the outer bottom surface 42(B). This second connection portion 76 has a relatively larger diameter 84 than the diameter 78 as well (e.g., the diameter 84 is the same as the diameter 80). Furthermore, the inner portion 74 is relatively long thus enabling the countersunk via 72 to pass completely from the top surface 42(T) through to the bottom surface 42(B). Accordingly, manufacturing aspects that characterize conventional through vias (e.g., the ability to easily remove plating, cleaning and other processing agents using gravity and/or compressed air, etc.) are available when manufacturing the countersunk via 72. Accordingly, there is less likelihood of having trapped materials in the countersunk via 72 and thus the aspect ratio of the inner portion 72 is capable of being relatively higher than that for the countersunk via 52.

In one arrangement, the inner portion 74 of the carved hole 34 has an aspect ratio of inner portion depth versus inner portion width of 7.0-to-1 or less (i.e., 7.0 or less to one) to enable proper cleaning and plating of the inner portion 74 following formation of the inner portion 74, and the two connecting portions 76. This aspect ratio is capable of being greater than that for the carved hole 34 in FIG. 2 because the carved hole 34 in FIG. 3 extends all the way through the circuit board structure 22 and is thus easier to clean as mentioned above.

For illustration purposes only, the countersunk via 72 is shown as a signal via which connects to multiple inner conductive layers 28. Anti-pads 86 defined by conductive planes 88 (e.g., power and ground planes) exist to ensure that the countersunk via 72 does not inadvertently connect to such a plane 88. For a via portion that is 16 mils in diameter, an anti-pad diameter of 40 mils is suitable for use. For a via portion that is 8 mils in diameter, an anti-pad diameter of 32 mils is suitable for use. For a via portion that is 4 mils in diameter, an anti-pad diameter of 24 mils is suitable for use.

Again, it should be understood that it is relatively easy to create the countersunk via 72. In particular, the manufacturer simply drills out material to create the carved hole 34, and then passes the circuit board structure 22 through a standard plating process. Drilling of the carved hole 34 may occur while drilling standard holes for through hole vias. Additionally, plating may occur during the same plating process for forming the through hole vias. There are no additional registration or lamination steps needed.

Figure 4:
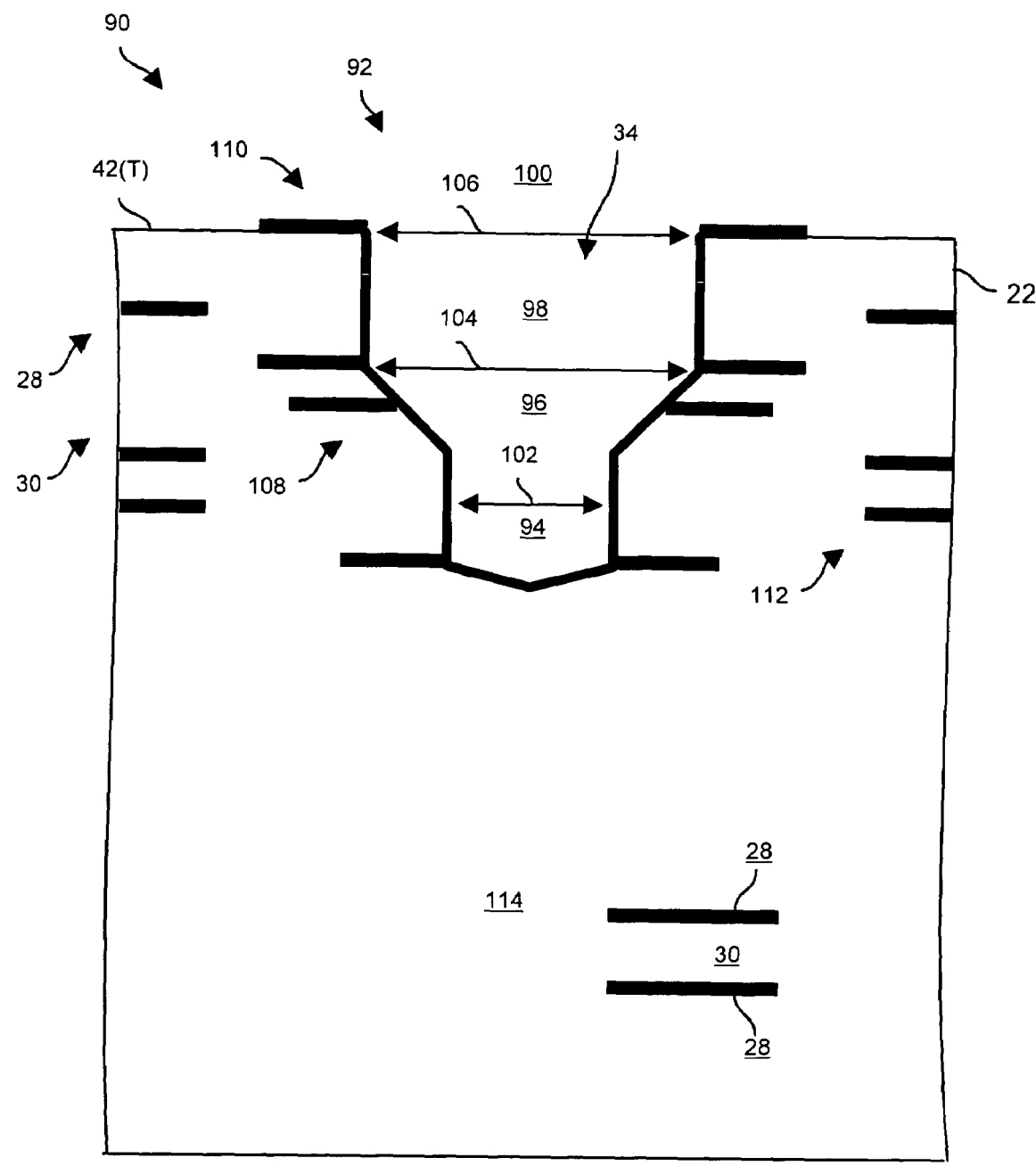
FIG. 4 is a cross-sectional side view of a third countersunk via which extends relatively deeply into the circuit board of FIG. 1.

FIG. 4 is a cross-sectional side view 90 of a third countersunk via 92 which is similar to the countersunk via 52 (FIG. 2) in that the countersunk via 92 (i) is formed from a carved hole 34 having an inner portion 94 and a connecting portion 96 and (ii) has a blind configuration. However, the countersunk via 92 differs from the countersunk via 52 in that the carved hole 34 for the countersunk via 92 further includes an outer portion 98 disposed between the connecting portion 96 and the outer top surface 42(T) before reaching an external location 100 outside the carved hole 34. Here, the inner portion 94 has a substantially uniform inner portion diameter 102. At least a portion of the connecting portion 96 has a diameter 104 which is larger than the diameter 102 of the inner portion 94. Additionally, the outer portion 98 has a substantially uniform outer portion diameter 106 which is at least as wide as the diameter 104 thus improving access to the inner portion 94 and the connecting portion 96 from the external location 100. The tapered shape of the connecting portion 96 (e.g., 130 degrees inclusive) smoothens the transition between the outer portion 98 and the inner portion 94.

It should be understood that the total depth of the countersunk via 92 is greater than the countersunk via 52 (FIG. 2). This increase in depth enables the countersunk via 92 to penetrate and connect to more conductive layers 28 of the circuit board structure 22 for greater fanout capacity. As with the countersunk vias 52, 72, this increase in fanout capacity provided by the countersunk via 92 may alleviate the need for an extra signal layer thus providing additional savings to the manufacturer. For illustration purposes, FIG. 2 shows the countersunk via 52 connecting to the internal pads 108 of several (e.g., three) inner conductive layers 28 in addition to a conductor 110 of the surface layer 42(T) of the structure 22 and in addition to penetrating through multiple power and ground plane layers 112.

Since the countersunk via 92 does not pass all of the way through the circuit board structure 22, other circuit board features are capable of being located underneath the countersunk via 92 between the countersunk via 92 and the outer bottom surface 42(B) for higher connection density (see the location 114 in FIG. 4), i.e., more conductive and non-conductive layer features.

In one arrangement, the inner portion 94 of the carved hole 34 has an aspect ratio of inner portion depth versus inner portion width of 0.5-to-1 or less to enable proper cleaning and plating of the inner portion 94 following formation of the inner portion 94, the connecting portion 96 and the outer portion 98 of the carved hole 34, since the carved hole 34 does not continue completely through the structure 22. By way of example, the diameter of the inner portion 94 is substantially 8 mils and the depth of the inner portion 94 is substantially 4 mils with a traditional error tolerance such as +3 mils. The inner portion 94 is further provided with over travel of substantially 1.5 mils. Additionally, the width of the connection portion 96 is substantially 12 mils and the depth of connecting portion 96 is substantially 3.7 mils. The drill angle, or taper of the connecting portion 96, is set to be substantially 118 degrees. Furthermore, the width of the outer portion 98 is substantially 12 mils and the depth of the outer portion 98 is substantially 4 mils. Accordingly, the aggregate depth of the countersunk via 92 is approximately 12 mils for robust fanout capacity. Moreover, the countersunk via 92 is capable of being formed using standard drilling and plating techniques without need of extra registration and lamination and pressing.

In an alternative arrangement, the outer portion 98 is substantially 16 mils in diameter and substantially 4 mils deep. As will be discussed in further detail shortly, the countersunk vias 52, 72, 92 are suitable for use as solderable pads, i.e., "solder-cup interconnects", and the diameter of the outer portion 98 is capable of being adjusted to accommodate various component contact sizes (e.g., different solder ball sizes, different pin sizes, etc.).

It should be understood that the countersunk configuration of the holes 34 for the vias 52, 72, 92 allows wet chemistries to more readily enter and exit the inner portions 54, 74, 94 during via formation. For example, since the inner portions 54, 74, 94 are able to maintain aspect ratio design rule compliance, the vias 52, 72, 92 can be processed through wet chemistries with their external surfaces pointing down to promote normal processing and drainage by gravity. Further details will now be provided with reference to FIGS. 5 and 6.

Figure 5:
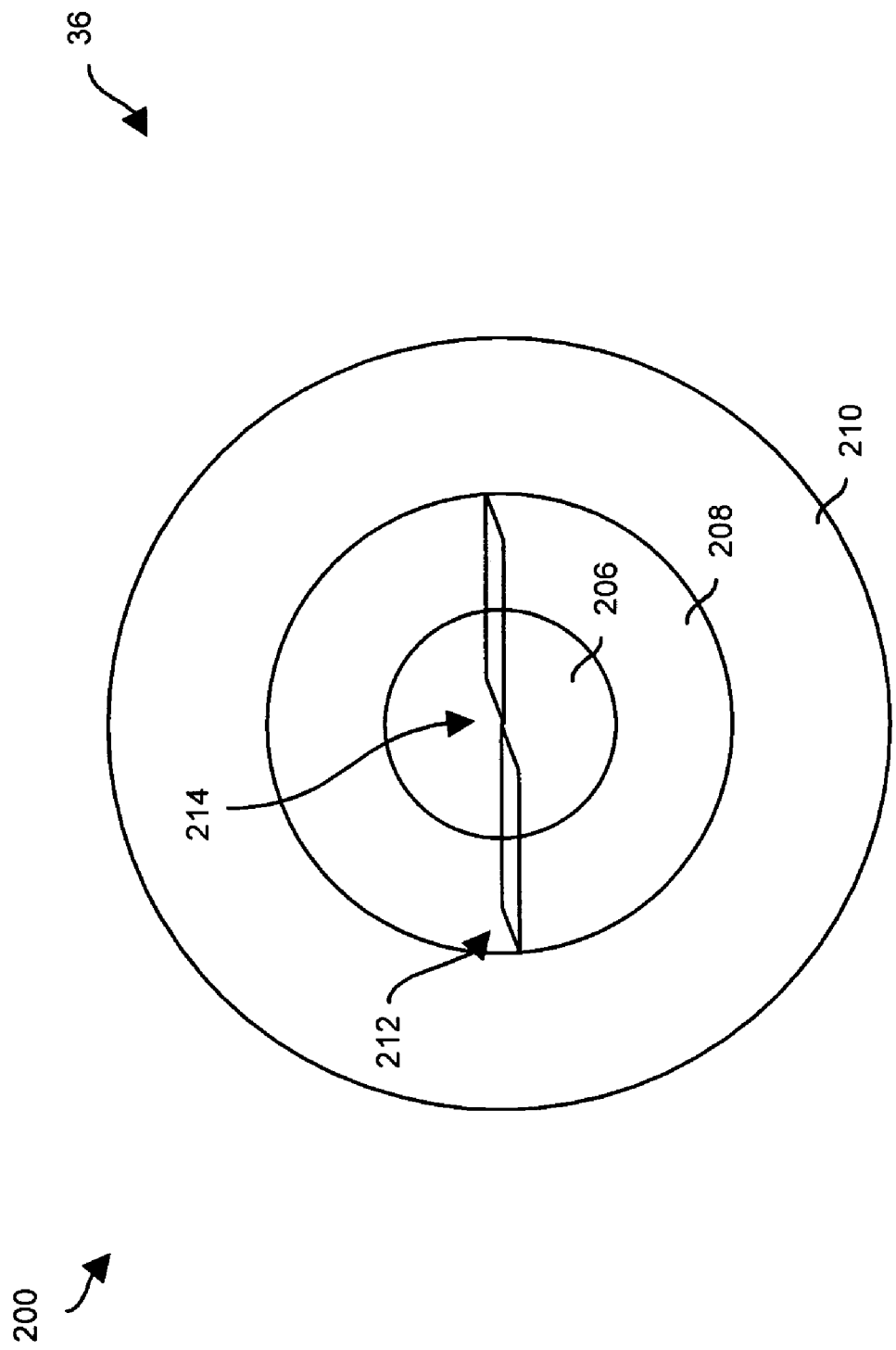
FIG. 5 is an end view of a countersinking drill bit which is suitable for use by circuit board fabrication equipment when making the circuit board of FIG. 1.
Figure 6:
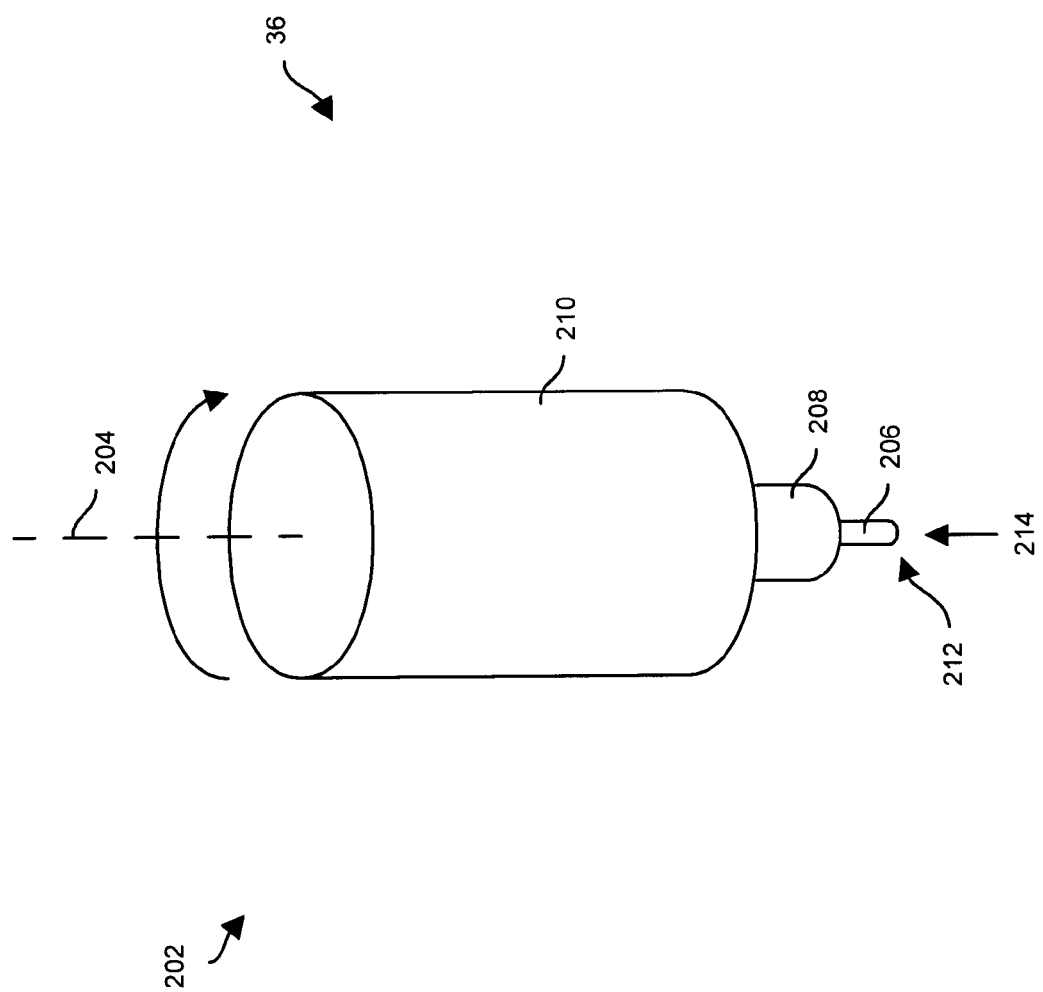
FIG. 6 is a perspective view of the countersinking drill bit of FIG. 5.

FIG. 5 is an end view 200, and FIG. 6 is a perspective view 202 of the countersinking drill bit 36 of FIG. 1. As mentioned earlier, the countersinking drill bit 36 is suitable for creating carved holes 34 when forming countersunk vias 24 within the circuit board structure 22. As shown in FIG. 6, the countersinking drill bit 36 is configured to rotate about a central axis 204. The bit 36 includes an elongated tip 206, a countersinking base 208, and a drill interface 210. The countersinking base 204 is disposed between the elongated tip 206 and the drill interface 210.

The drill interface 210 (e.g., a hexagonal head, etc.) is configured to fit within drilling equipment (e.g., automated robotics for precise and consistent circuit board drilling). During such drilling, the elongated tip 206 is configured to carve out the inner portions 54, 74, 94 (also see FIGS. 2 through 4). The countersinking base 208 is configured to carve out the connecting portions 56, 76, 96 of the countersunk via holes 34. For the countersunk via 72 of FIG. 3, the countersinking base 208 is further configured to carve out the second connecting portion 74 on the outer bottom surface 42(B) in response to movement of the drill bit 36 to the opposite side of the circuit board structure 22 by the drilling equipment. For the countersunk via 92 of FIG. 4, the countersinking base 208 is further configured to carve out the outer portion 98 due to deeper insertion of the countersinking drill bit 36 into the circuit board structure 22 in the Z-direction. It should be understood that all of the above-described drilling is capable of being performed at the same time during the drilling process for creating holes for conventional through vias. Accordingly, all countersunk vias and through vias are capable of being drilled together in one drilling operation to reduce manufacturing cycle time and to provide only one effective registration tolerance of drilled holes to copper features. Moreover, additional fabrication, registration and lamination steps are unnecessary when forming the carved holes 34.

As shown in FIGS. 5 and 6, the tip 206 of the countersinking drill bit 36 includes a set of cutting blades 212 which are configured to cut through circuit board material. Each blade 212 extends radially from a center 214 of the countersinking drill bit 36. By way of example, two blades 212 reside the elongated tip 206, and two more blades 212 reside on the countersinking base 208 which align with the blades 212 on the elongated tip 206. The blades 212 are preferably provisioned with the proper tool angle for robust drilling and for providing the proper taper in the connecting portions 56, 76, 96 (e.g., 130 degrees inclusive). Other blade configurations are suitable for use as well (e.g., four blades 212 on the tip 206 and another four blades 212 on the base 208, six blades 212, etc.). Cutting tools based on bottom cutting end-mill or reamer multi-fluted geometries are capable of being adapted to operate as the countersinking drill bit 36. Such adapted tools typically include more blades 212 (i.e., cutting teeth or facets) and thus are better balanced with minimal machining chatter for more consistent hole carving and smoother surface topologies (e.g., for improved adhesion of electroless copper during plating).

It should be understood that the countersinking drill bit 36 alleviates the need for performing two drilling operations when forming each hole 34, and thus avoids the associated tolerance buildup between two drilling operations. Rather, the countersinking drill bit 36 is a step or combination drilling tool where the two diameters (i.e., the inner portion diameter and the connecting portion diameter) and the countersink angle are built into one tool. Moreover, since these features are fixed relative to each other on the countersinking drill bit 36, the countersinking drill bit 36 maintains a common depth constant where both the inner portion and the connecting portion dimensions are always the same distance apart regardless of whether the hole 34 is drilled to a nominal depth or on the deep side of the tolerance.

It should be further understood that other drilling techniques are suitable for use as well when forming the carved hole 34 such as laser machining. Further details of the invention will now be provided with reference to FIG. 7.

Figure 7:
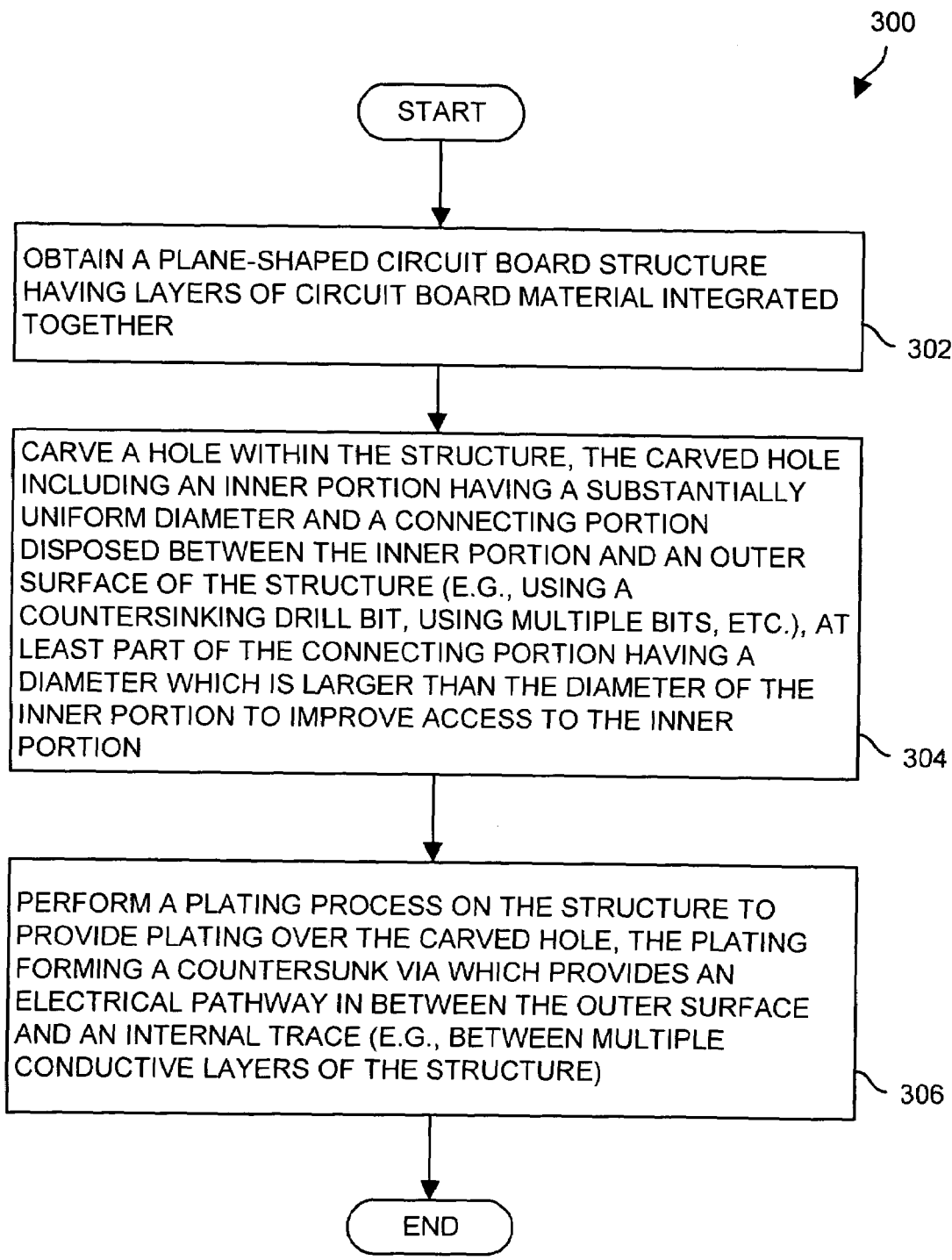
FIG. 7 is a flowchart of a procedure which is performed when making the circuit board of FIG. 1.

FIG. 7 is a flowchart 300 of a procedure which is performed by a circuit board manufacturer when making the circuit board structure 22. In step 302, manufacturer obtains a plane-shaped circuit board structure or substrate 22 having layers of circuit board material 26 integrated together (FIG. 1).

In step 304, the manufacturer carves a hole 34 within the plane-shaped circuit board structure 22 (see FIGS. 2 through 4). In one arrangement, the manufacturer applies the countersinking drill bit 36 to the circuit board structure 22. In another arrangement, the manufacturer separately drills the inner portion and the connecting portion using separate standard shaped drill bits (e.g., the larger diameter portion first). Step 304 is capable of being performed concurrently with other drilling procedures for creating other types of holes (e.g., holes for standard through hole vias).

In step 306, the manufacturer performs a plating process on the circuit board structure 22 to provide plating over the hole 34 carved within the structure 22. The plating forms a countersunk via which provides an electrical pathway from the outer surface of the structure 22 to an internal circuit board trace. Due to maintained compliance with certain aspect ratio design rules for the inner portion and the connecting portion, there is no increased risk or difficulty during the plating and cleaning processes. Rather, plating and cleaning agents are free to robustly enter and exit the inner portion due to the wideness of the connecting portion thus avoiding trapping unwanted material within the inner portion (e.g., acid). Further details of the invention will now be provided with reference to FIG. 8.

Figure 8:
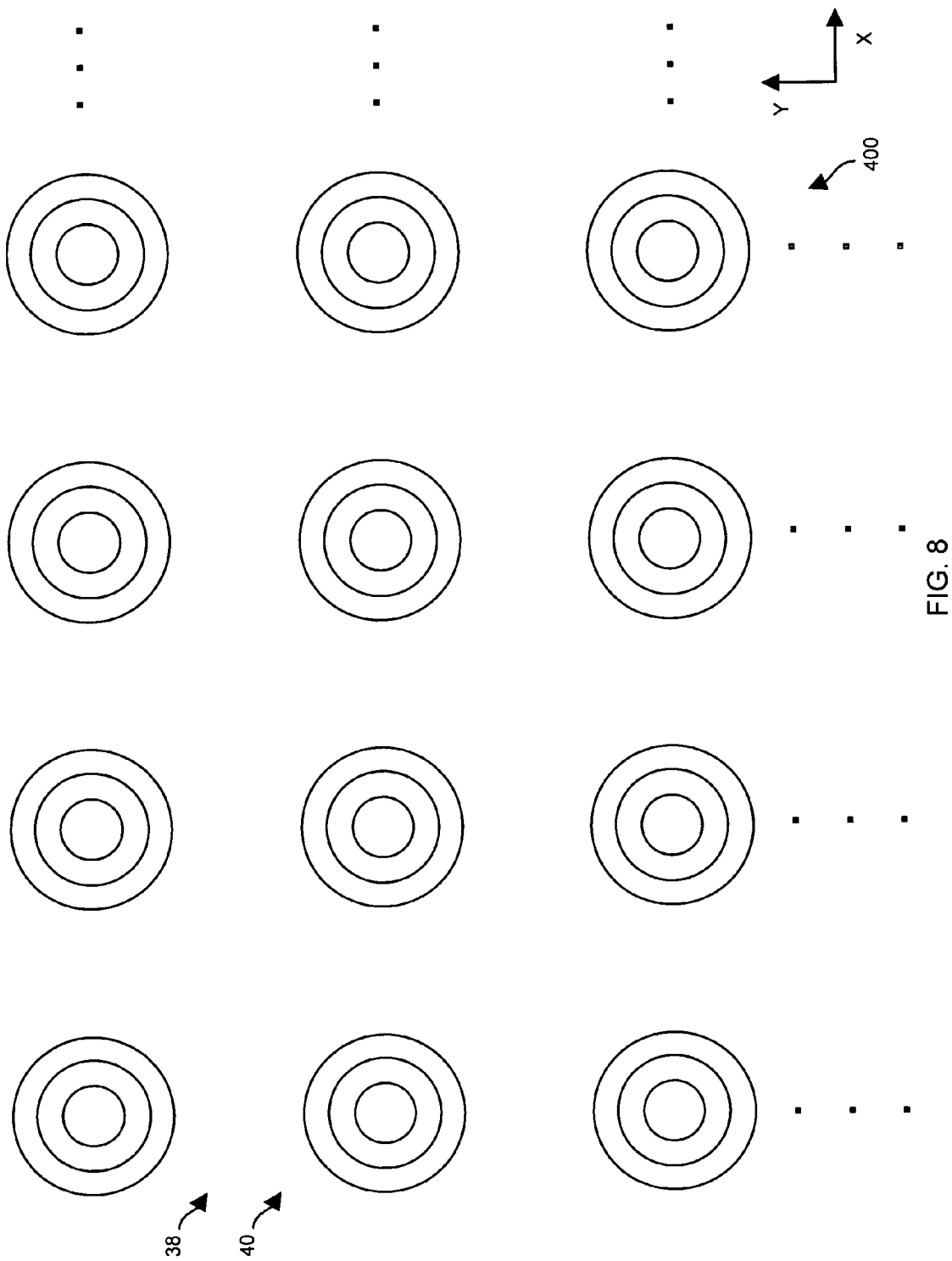
FIG. 8 is a top view of a mounting location of the circuit board of FIG. 1 which is suitable for use in mounting with an Area Array Package (AAP).

FIG. 8 is a top view 400 of the mounting location 38 of FIG. 1 which is suitable for use in mounting with the component 32 (e.g., an Area Array Package). As shown in FIG. 8, the mounting location 38 includes an array 40 of countersunk vias which extends two-dimensionally in the X and Y directions. In particular, any one of the countersunk vias 52, 72, 92 of FIGS. 2 through 4 are capable of being used in the array 40. In one arrangement, the countersunk vias 52, 72, 92 connect to surface mount pads in a traditional "dog bone" style, i.e., via, then surface trace, then surface mount pad. In another arrangement, the countersunk vias 52, 72, 92 operate as pads themselves, i.e., "solder-cup interconnects". That is, in this latter arrangement, the upper parts of the countersunk vias 52, 72, 92 solder directly to corresponding contacts (e.g., balls, columns, pins, etc.) of the component 32.

Due to the formation of the countersunk vias 52, 72, 92 and their use as soldering pads, there is lower inductance with little or no reflective stubs. Accordingly, there is improved signal integrity characteristics provided by the countersunk vias 52, 72, 92 when using them as soldering pads and such vias 52, 72, 92 are well suited for carrying high frequency signals. Further details of the invention will now be provided with reference to FIGS. 9 and 10.

Figure 9:
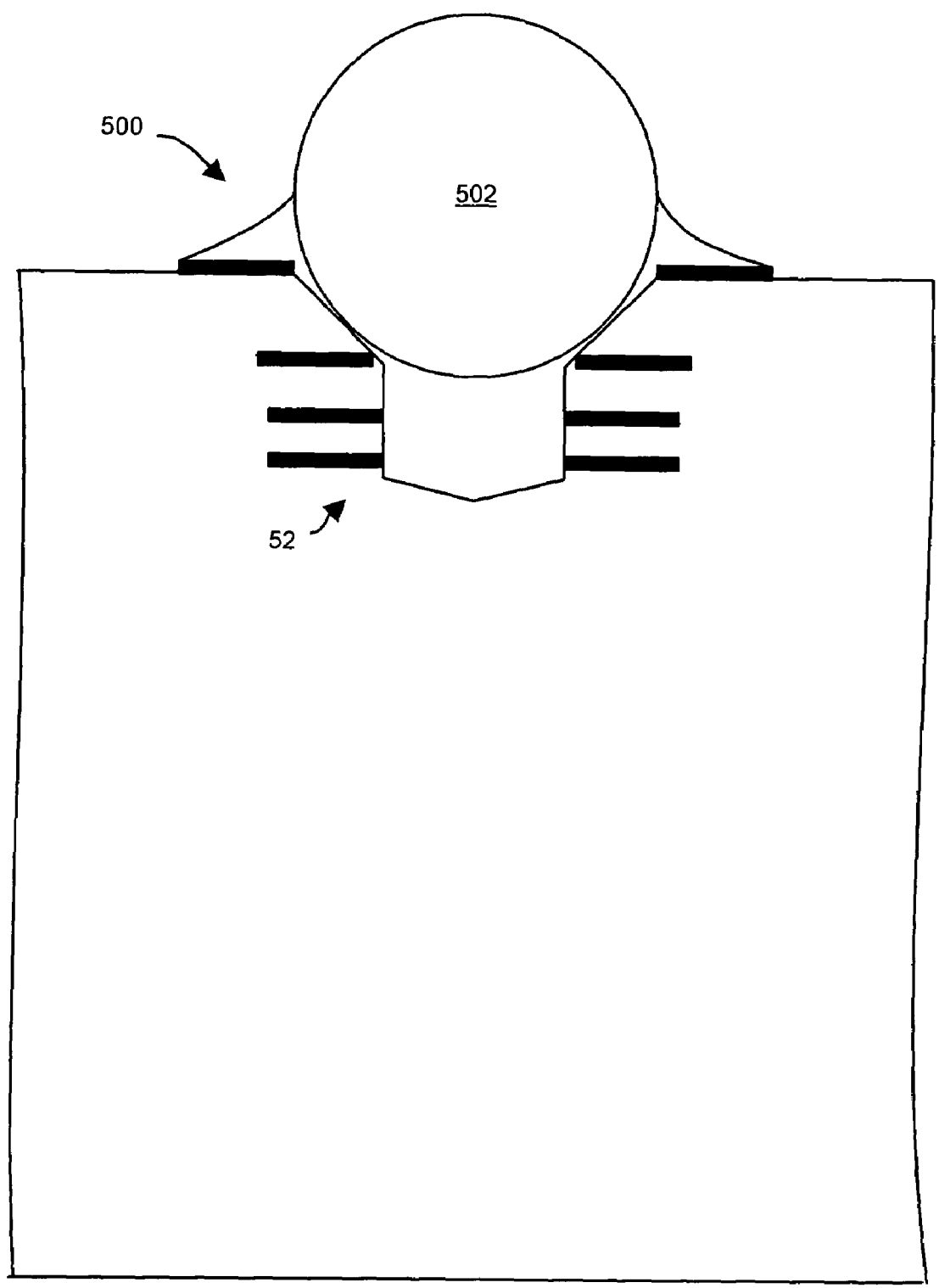
FIG. 9 is a cross-sectional side view of a solder joint interconnection which involves the countersunk via of FIG. 2 and a ball-shaped contact of a first AAP device.

FIG. 9 is a cross-sectional side view of a solder joint interconnection 500 which involves the countersunk via 52 of FIG. 2 and a ball-shaped contact 502 of an AAP device (also see the AAP component 32 in FIG. 1). By way of example, a contact pitch of 1.0 mm is suitable for use for the contact interface of the AAP device (see the arrow 46 in FIG. 1). As shown in FIG. 9, the ball-shaped contact 502 robustly solders to the countersunk via 52 for reliable mechanical and electrical connectivity.

To form the solder joint interconnection 500 (i.e., a solder-cup interconnect), a manufacturer first prints solder paste over an array 40 of countersunk vias 52 (e.g., using automated solder paste printing equipment such as a stencil and a squeegee). Next, the manufacturer places the balls of the AAP device in contact with the printed solder paste (e.g., using pick-and-place equipment). Then, the manufacturer applies heat (e.g., passes the structure 22 through an oven). Solder within the paste melts and flows into the inner portion and around the exposed via surfaces and balls. Flux within the paste removes oxidation and cleans the metal surfaces for robust solder wetting. Accordingly, a set of solder joints 500 form between the countersunk vias 52 and the ball-shaped contacts 502. The solder volume should have sufficient mass to absorb normal thermal stresses generated during subsequent operation of the circuit board 20 (i.e., to accommodate mismatches in rates and degrees of thermal expansion between the circuit board structure 22 and the component).

It should be understood that use of the countersunk vias 52 as pads for mounting to the AAP device is well suited for situations in which thermal stresses and expansion do not pose a great threat to manufacturability. In these situations, the mounted AAP device enjoys improved signal integrity and a reliable high density connection with the circuit board structure 22. Accordingly, this situation is very well suited for high frequency applications where preservation of signal integrity characteristics is critical.

It should be further understood that the countersunk vias 52 do not need to be filled with epoxy since they are filled by the solder joint 500. In particular, proper cleaning, heating and wetting will ensure robust wicking of liquidus solder into the inner portion 54 and proper ventilation of gas from the inner portion 54.

Figure 10:
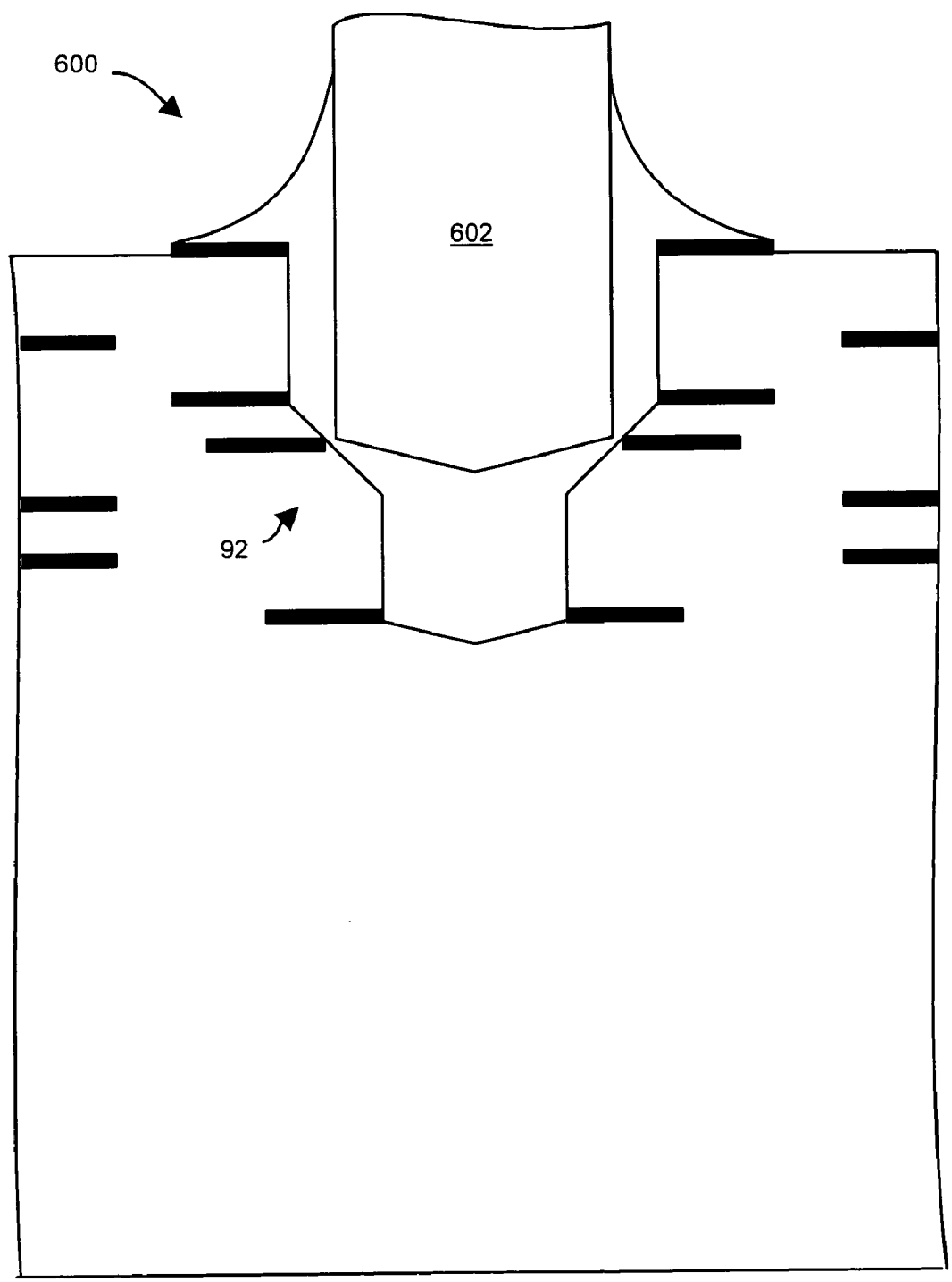
FIG. 10 is a cross-sectional side view of a solder joint interconnection which involves the countersunk via of FIG. 4 and a pin-shaped contact of a second AAP device.

FIG. 10 is a cross-sectional side view of a solder joint interconnection 600 which involves the countersunk via 92 of FIG. 4 and a pin-shaped contact 602 of a second AAP device (again also see the component 32 in FIG. 1). As shown, the ball-shaped contact 602 robustly solders to the countersunk via 92 for reliable mechanical and electrical connectivity.

To form the solder joint interconnection 600 (i.e., another solder-cup interconnect), a manufacturer first prints solder paste over an array 40 of countersunk vias 92. Then, the manufacturer places the balls of the AAP device in contact with the printed solder paste. Subsequently, the manufacturer applies heat. Solder within the paste melts and flows into the inner portion and around the exposed via surfaces and pins. Flux within the paste removes oxidation and cleans the metal surfaces for robust solder wetting. Accordingly, a set of solder joints 600 form between the countersunk vias 92 and the pin-shaped contacts 602.

Again, it should be understood that use of the countersunk vias 92 as pads for mounting to the AAP device is well suited for situations in which thermal stresses and expansion do not pose a great threat to manufacturability. In these situations, the mounted AAP device enjoys improved signal integrity and a reliable high density connection with the circuit board structure 22.

It should be further understood that use of the contacts 602 provides a simple alternative to certain other types of AAP device contacts such as eye-of-the-needle type contacts which are more difficult and costly to make and use. The relatively straighter tapered surfaces are easy to cut (e.g., stamp) from metal stock and do not require any compression or movement as do eye-of-the-needle type contacts thus simplifying manufacture and use. Furthermore, the pin-shape of the contacts 602 enables some degree of stressing beyond that obtainable from ball-shape contacts, and the lengths of the contacts 602 are easy to control and modify without affecting other dimensions of the contacts 602 as would be the case for balls-shaped contacts thus providing further design flexibility. Further details of the invention will now be provided with reference to FIG. 11.

Figure 11:
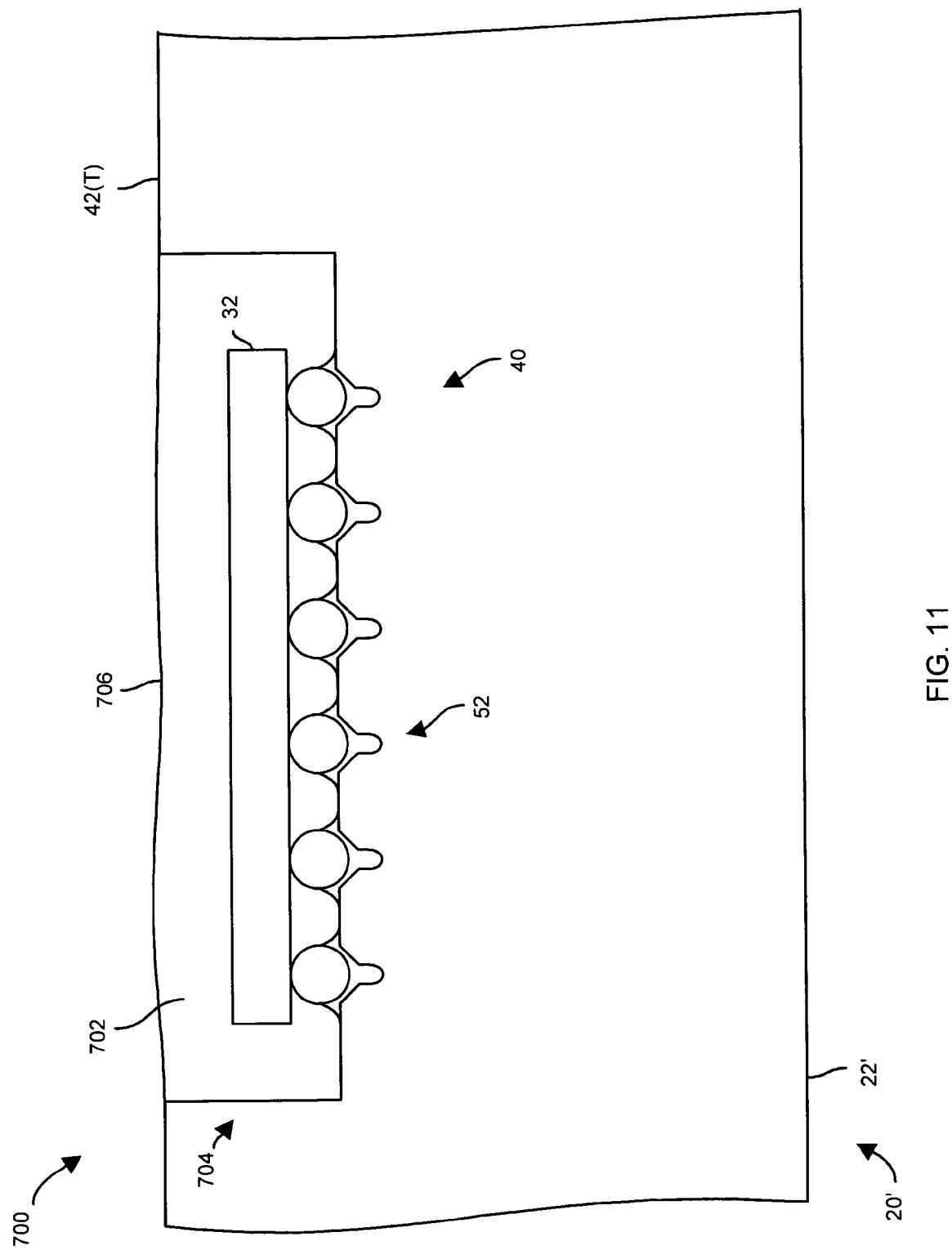
FIG. 11 is a cross-sectional side view of a circuit board having a carve-out area which is suitable for using the countersunk vias of FIGS. 2 through 4.

FIG. 11 is a cross-sectional side view 700 of a circuit board 20' having a circuit board structure 22', a set of countersunk vias 52, a component 32, and potting compound 702 (e.g., acrylic). The circuit board structure 22' is similar to the circuit board structure 22 (FIG. 1) except that the circuit board structure 22' includes a carve-out area 704 which is formed within the circuit board structure 22' beneath the outer surface 42(T). The countersunk vias 52, the component 32, and the potting compound 702 reside within the carve-out area 704. By way of example only, the component 32 is a BGA device and the countersunk vias 52 forms an array 40 (also see FIG. 8) for mounting the BGA device. In one arrangement, the outer surface 706 of the potting compound is made flush the outer surface 42(T) thus blending the two surfaces 42(T), 706 together. Accordingly, the component 32 and the countersunk vias 52 are essentially embedded within the circuit board 20' in a highly integrated manner. That is, the carve-out area 704 is a region which sits beneath the outer surface 42(T) to enable embedding of one or more circuit board components 32 within the circuit board 20'.

To install the component 32 within the circuit board 20' as shown in FIG. 11, a manufacture mills out a flat island plane in the middle of the structure 22' to define the carve-out area 704 and then drills the concave carved holes 34 that will eventually form the countersunk vias 52. In particular, the manufacturer can drill the holes 34 straight through photoresist that has been deposited over the outer surface 42(T) of the circuit board 20' as part of the etching process. Later, the manufacturer forms the countersunk vias 52 within the carve-out area 704 during the regular plating process which concurrently forms other vias on the circuit board structure 22' (e.g., standard through vias). Then, during circuit board assembly, the manufacturer solders the component 32 to the countersunk vias 32 (e.g., using standard SMT technology). Subsequently, the manufacturer installs the potting compound 702 to fill the carve-out area 704 and flattens the outer surface 706 thus encapsulating the component 32 within the circuit board 20'.

The circuit board 20' of FIG. 11 is capable of providing a variety of desirable features. For example, the countersunk vias 52 of the circuit board 20' are well suited for high performance applications due to the lack of stub lengths when connecting to the component 32. Additionally, the circuit board 20' is well suited for high security situations (e.g., the component 32 is a security or intelligence chip) since material for the potting compound 702 is capable of being chosen to prevent tampering and removal of the component 32 with the component 32 remaining intact. Furthermore, the circuit board 20' provides robust electromagnetic interference (EMI) shielding of the component 32 thus alleviating the need for a separate EMI shield. Also, the circuit board 20' is capable of having a lower profile, e.g., the potting compound 702 is capable of having a high thermal transfer coefficient and a heat sink is capable of mounting flush to the surfaces 42(T), 706 for tight or narrow installations and higher density configurations. Moreover, as mentioned earlier, the use of the countersunk vias 52 enables the vias 52 to connect to deeper layers than otherwise achievable with standard vias.

It should be understood that no photo imaging process is required to form the countersunk vias 52. Rather, the carve-out area 704 and the carved holes 34 can be made using a non-photographic imaging method by simply drilling through photoresist and not copper pads to enable the metallic features to be formed by a subsequent plating process. That is, since the contacts of the component 32 solder to the vias 52 themselves and not to separate surface mount pads in the circuit board 20', there is no need to form exposed surface etch inside the carve-out area 704.

It should be further understood that any of the countersunk vias 52, 72, 92 are suitable for use in the carve-out area 704 and that countersunk vias 52 (FIG. 2) were shown in the carve-out area 704 by way of example only. The countersunk via 72 (FIG. 3) is well suited for deep aspect ratio electrical connections. The countersunk via 92 (FIG. 4) is well suited for deep aspect ratio electrical connections and deeper recessing of the component 32 below the outer surface 42(T).

As mentioned above, embodiments of the invention are directed to circuit board manufacturing techniques which involve carving a countersunk via hole 34 within circuit board material to form a countersunk via 52, 72, 92. Such carving is capable of taking place at the same time as the drilling process for creating through vias thus alleviating the need for an additional registration, laminating and pressing process which would otherwise increase costs (e.g., as required when creating conventional blind and buried vias). Furthermore, the countersunk via 52, 72, 92 resulting from such carving is capable of interconnecting with several conductive layers 28 by going deeper into the circuit board material than a conventional blind via without posing a manufacturability or quality threat thus providing greater opportunity to achieve higher fanout and thus perhaps alleviating the need for additional circuit board layers 26.

While this invention has been particularly shown and described with references to preferred embodiments thereof, it will be understood by those skilled in the art that various changes in form and details may be made therein without departing from the spirit and scope of the invention as defined by the appended claims.

For example, the countersunk via 92 of FIG. 4 was shown as having a blind configuration by way of example only. The countersunk via 92 is capable of having a through via configuration with a traditional via opening at the opposite end, a via opening such as the via 52 (FIG. 2) at the opposite end, a via opening such as the via 92 (FIG. 4) at the opposite end, etc.

Additionally, it should be understood that the various intersections of the inner portions, connecting portions and outer portions where shown in FIGS. 2 through 4 as being relatively sharp angles by way of example only. In other arrangements, the transition radii between these portions are smooth (e.g., curved). These latter arrangements facilitate certain plating aspects (e.g., reduces internal copper plating stress, reduces plating folds, etc.).

Furthermore, it should be understood that the circuit board structure 22 was described above as including FR-4 (e.g., for an epoxy-glass-copper substrate) by way of example only. Other materials are suitable for use as well for the structure 22 such as silicon-metal based structures, enamelized steel substrates, Teflon® based substrates, hybrid circuit ceramic based structures, PFE based or impregnated circuits, polyamide, cyanate ester, aramide, phenolic based substrated, hybrid circuit substrate material structures with glass or non-glass insulators, etc.

What is claimed is:

1. A method for manufacturing a circuit board, the method comprising:

obtaining a plane-shaped structure having layers of circuit board material integrated together;

carving a hole within the plane-shaped structure, the carved hole including an inner portion having a substantially uniform inner portion diameter and a connecting portion disposed between the inner portion and an outer surface of the plane-shaped structure, at least part of the connecting portion having a diameter which is larger than the substantially uniform inner portion diameter of the inner portion to improve access to the inner portion; and performing a plating process on the plane-shaped structure to provide plating over the hole carved within the plane-shaped structure, the provided plating forming a countersunk via which provides an electrical pathway from the outer surface of the plane-shaped structure to an internal circuit board trace;

wherein carving the hole includes:

applying a countersinking drill bit to the plane-shaped structure in a single drilling operation to drill the hole within the plane-shaped structure, the countersinking drill bit having an elongated tip and a countersinking base, the elongated tip being configured to form the inner portion having the substantially uniform inner portion diameter, the countersinking base being configured to form the connecting portion disposed between the inner portion and the outer surface.

2. The method of claim 1 wherein applying the countersinking drill bit includes:

providing the inner portion of the carved hole with an aspect ratio of inner portion depth versus inner portion width which is less than 7-to-1 to enable proper cleaning and plating of the inner portion after the inner and connecting portions of the carved hole are formed.

3. The method of claim 1 wherein carving the hole further includes:

stopping the countersinking drill bit from completely penetrating through the plane-shaped structure to enable the carved hole which includes the inner portion and the connecting portion to form a blind via as the countersunk via.

4. The method of claim 3 wherein carving the hole further includes:

providing the inner portion of the carved hole with an aspect ratio of inner portion depth versus inner portion width which is less than 0.5-to-1 to enable proper cleaning and plating of the inner portion after the carved hole is formed.

5. The method of claim 3, further comprising:

printing solder paste over the blind via to substantially fill the blind via with solder during a soldering process.

6. The method of claim 5 wherein the soldering process is a Surface Mount Technology (SMT) soldering process; wherein the method further comprises:

placing a ball-shaped contact of an area array package in contact with the printed solder paste to solder the ball-shaped contact to the blind via during the SMT soldering process.

7. The method of claim 5 wherein the soldering process is a Surface Mount Technology (SMT) soldering process; wherein the method further comprises:

placing a pin-shaped contact of an area array package in contact with the printed solder paste to solder the ball-shaped contact to the blind via during the SMT soldering process.

8. The method of claim 5, further comprising:
prior to the performing the plating process, carving additional holes within the plane-shaped structure to enable the plating process to form a high density array of countersunk vias from the carved hole and the additional carved holes, the high density array of countersunk vias being configured to mount with an integrated circuit package having a high density array of corresponding package contacts.

9. The method of claim 1 wherein carving the hole includes:
forming the carved hole within a carve-out area of the plane-shaped structure, the carve-out area being a region sitting beneath the outer surface to enable embedding of a circuit board component within the plane-shaped structure when installing the circuit board component onto the countersunk via.

10. The method of claim 1 wherein carving the hole includes:
drilling the hole to further include an outer portion disposed between the connecting portion and the outer surface of the plane shaped structure, the outer portion having a substantially uniform outer portion diameter which is greater than the substantially uniform inner portion diameter of the inner portion, the connecting portion providing a taper between the substantially uniform outer portion diameter and the substantially uniform inner portion diameter.

11. A method for manufacturing a circuit board, the method comprising:
obtaining a plane-shaped structure having layers of circuit board material integrated together;
carving a hole within the plane-shaped structure, the carved hole including an inner portion having a substantially uniform inner portion diameter and a connecting portion disposed between the inner portion and an outer surface of the plane-shaped structure, at least part of the connecting portion having a diameter which is larger than the substantially uniform inner portion diameter of the inner portion to improve access to the inner portion; and
performing a plating process on the plane-shaped structure to provide plating over the hole carved within the plane-shaped structure, the provided plating forming a countersunk via which provides an electrical pathway from the outer surface of the plane-shaped structure to an internal circuit board trace;
wherein carving the hole includes:
drilling the hole to further include an outer portion disposed between the connecting portion and the outer surface of the plane shaped structure, the outer portion having a substantially uniform outer portion diameter which is greater than the substantially uniform inner portion diameter of the inner portion, the connecting portion providing a taper between the substantially uniform outer portion diameter and the substantially uniform inner portion diameter.

12. The method of claim 11 wherein applying the countersinking drill bit includes:
providing the inner portion of the carved hole with an aspect ratio of inner portion depth versus inner portion width which is less than 7-to-1 to enable proper cleaning and plating of the inner portion after the carved hole is formed.

13. The method of claim 11 wherein carving the hole further includes:
stopping the countersinking drill bit from completely penetrating through the plane-shaped structure to enable the carved hole to form a blind via as the countersunk via.

14. The method of claim 13 wherein carving the hole further includes:
providing the inner portion of the carved hole with an aspect ratio of inner portion depth versus inner portion width which is less than 0.5-to-1 to enable proper cleaning and plating of the inner portion after the carved hole is formed.

15. A method for manufacturing a circuit board, the method comprising:
obtaining a plane-shaped structure having layers of circuit board material integrated together;
carving a hole within the plane-shaped structure, the carved hole including an inner portion having a substantially uniform inner portion diameter and a connecting portion disposed between the inner portion and an outer surface of the plane-shaped structure, at least part of the connecting portion having a diameter which is larger than the substantially uniform inner portion diameter of the inner portion to improve access to the inner portion;
performing a plating process on the plane-shaped structure to provide plating over the hole carved within the plane-shaped structure, the provided plating forming a countersunk via which provides an electrical pathway from the outer surface of the plane-shaped structure to an internal circuit board trace; and
printing solder paste over the countersunk via to substantially fill the countersunk via with solder during a soldering process.

16. The method of claim 15, further comprising:
placing a ball-shaped contact of an area array package in contact with the printed solder paste to solder the ball-shaped contact to the countersunk via during the soldering process.

17. The method of claim 15, further comprising:
placing a pin-shaped contact of an area array package in contact with the printed solder paste to solder the pin-shaped contact to the countersunk via during the soldering process.

18. The method of claim 15, further comprising:
prior to the performing the plating process, carving additional holes within the plane-shaped structure to enable the plating process to form a high density array of countersunk vias from the carved hole and the additional carved holes, the high density array of countersunk vias being configured to mount with an integrated circuit package having a high density array of corresponding package contacts.

19. The method of claim 15 wherein carving the hole includes:
forming the carved hole within a carve-out area of the plane-shaped structure, the carve-out area being a region sitting beneath the outer surface to enable embedding of a circuit board component within the plane-shaped structure when installing the circuit board component onto the countersunk via.

20. The method of claim 15 wherein carving the hole includes:

drilling the hole to further include an outer portion disposed between the connecting portion and the outer surface of the plane shaped structure, the outer portion having a substantially uniform outer portion diameter which is greater than the substantially uniform inner portion diameter of the inner portion, the connecting portion providing a taper between the substantially uniform outer portion diameter and the substantially uniform inner portion diameter.

21. The method of claim 15 wherein carving the hole further includes:

stopping the countersinking drill bit from completely penetrating through the plane-shaped structure to enable the carved hole to form a blind via as the countersunk via.

22. The method of claim 21 wherein carving the hole further includes:

providing the inner portion of the carved hole with an aspect ratio of inner portion depth versus inner portion width which is less than 0.5-to-1 to enable proper cleaning and plating of the inner portion after the carved hole is formed.

23. The method of claim 15, further comprising:

prior to the performing the plating process, carving additional holes within the plane-shaped structure to enable the plating process to form a high density array of countersunk vias from the carved hole and the additional carved holes, the high density array of countersunk vias being configured to surface mount an area array package having a high density array of corresponding package contacts.

* * * * *